US008757177B2

(12) United States Patent
Kholodenko et al.

(10) Patent No.: US 8,757,177 B2
(45) Date of Patent: Jun. 24, 2014

(54) MULTI-STAGE SUBSTRATE CLEANING METHOD AND APPARATUS

(71) Applicants: Arnold Kholodenko, San Francisco, CA (US); Katrina Mikhaylichenko, San Jose, CA (US); Cheng-Yu (Sean) Lin, Cupertino, CA (US); Mark Wilcoxson, Oakland, CA (US); Leon Ginzburg, Santa Clara, CA (US); Mark Kawaguchi, Sunnyvale, CA (US)

(72) Inventors: Arnold Kholodenko, San Francisco, CA (US); Katrina Mikhaylichenko, San Jose, CA (US); Cheng-Yu (Sean) Lin, Cupertino, CA (US); Mark Wilcoxson, Oakland, CA (US); Leon Ginzburg, Santa Clara, CA (US); Mark Kawaguchi, Sunnyvale, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 13/670,006

(22) Filed: Nov. 6, 2012

(65) Prior Publication Data
US 2013/0068261 A1 Mar. 21, 2013

Related U.S. Application Data

(62) Division of application No. 12/465,594, filed on May 13, 2009, now Pat. No. 8,317,934.

(51) Int. Cl.
*H01L 21/673* (2006.01)
(52) U.S. Cl.
USPC ............ 134/49; 134/50; 134/95.1; 134/95.2; 134/902; 427/346; 427/424; 427/477

(58) Field of Classification Search
USPC ...... 134/49, 50, 95.1–95.2, 99.1, 167 R, 902; 15/302, 306.1; 198/619; 438/758–794
See application file for complete search history.

(56) References Cited

U.S. PATENT DOCUMENTS

| 4,311,266 | A | * | 1/1982 | Kondo | 228/40 |
|---|---|---|---|---|---|
| 4,715,392 | A | * | 12/1987 | Abe et al. | 134/62 |
| 4,805,761 | A | * | 2/1989 | Totsch | 198/619 |
| 5,647,477 | A | * | 7/1997 | Morishita | 198/619 |
| 5,881,649 | A | * | 3/1999 | Hasegawa et al. | 104/167 |
| 6,509,278 | B1 | | 1/2003 | Chen | |
| 6,799,588 | B1 | * | 10/2004 | Speh et al. | 134/64 R |
| 7,080,727 | B1 | * | 7/2006 | Sanderson | 198/680 |
| 7,252,097 | B2 | * | 8/2007 | Boyd et al. | 134/57 R |
| 7,293,950 | B2 | * | 11/2007 | Bonora et al. | 414/217.1 |
| 7,329,321 | B2 | * | 2/2008 | Yun et al. | 134/15 |

(Continued)

FOREIGN PATENT DOCUMENTS

WO WO 2008059013 A1 * 5/2008
WO WO 2009085840 A2 * 7/2009

*Primary Examiner* — Joseph L Perrin
*Assistant Examiner* — Kevin G Lee
(74) *Attorney, Agent, or Firm* — Martine Penilla Group, LLP

(57) ABSTRACT

A first application of a cleaning material is made to a surface of a substrate. The cleaning material includes one or more viscoelastic materials for entrapping contaminants present on the surface of the substrate. A first application of a rinsing fluid is made to the surface of the substrate so as to rinse the cleaning material from the surface of the substrate. The first application of the rinsing fluid is also performed to leave a residual thin film of the rinsing fluid on the surface of the substrate. A second application of the cleaning material is made to the surface of the substrate having the residual thin film of rinsing fluid present thereon. A second application of the rinsing fluid is then made to the surface of the substrate so as to rinse the cleaning material from the surface of the substrate.

17 Claims, 10 Drawing Sheets

(56) References Cited

U.S. PATENT DOCUMENTS

| | | | |
|---|---|---|---|
| 7,426,883 B2 * | 9/2008 | Nishio et al. | 83/435 |
| 7,766,566 B2 * | 8/2010 | Kitano et al. | 396/611 |
| 8,261,905 B2 * | 9/2012 | Kholodenko et al. | 198/619 |
| 2005/0145265 A1 * | 7/2005 | Ravkin et al. | 134/21 |
| 2005/0217703 A1 * | 10/2005 | O'Donnell | 134/21 |
| 2005/0221621 A1 * | 10/2005 | Mikhaylichenko et al. | 438/745 |
| 2006/0005860 A1 * | 1/2006 | Garcia | 134/26 |
| 2006/0207636 A1 * | 9/2006 | Garcia et al. | 134/199 |
| 2006/0269877 A1 * | 11/2006 | Boyd et al. | 430/326 |
| 2007/0155640 A1 * | 7/2007 | Freer et al. | 510/175 |

\* cited by examiner

MULTI-STAGE SUBSTRATE CLEANING METHOD AND APPARATUS

CLAIM OF PRIORITY

This application is a divisional application of U.S. patent application Ser. No. 12/465,594, filed on May 13, 2009, entitled "Multi-Stage Substrate Cleaning Method and Apparatus." The above-identified patent applications is incorporated herein by reference in its entirety.

CROSS-REFERENCE TO RELATED APPLICATIONS

This application is related to the following U.S. Patent Applications:
- U.S. patent application Ser. No. 12/131,654, filed on Jun. 2, 2008, entitled "Materials for Particle Removal by Single-Phase and Two-Phase Media,"
- U.S. patent application Ser. No. 12/131,660, filed on Jun. 2, 2008, entitled "Methods for Particle Removal by Single-Phase and Two-Phase Media,"
- U.S. patent application Ser No. 12/131,667, filed on Jun. 2, 2008, entitled "Apparatus for Particle Removal by Single-Phase and Two-Phase Media,"
- U.S. patent application Ser. No. 11/532,491, filed on Sep. 15, 2006, entitled "Method and Material for Cleaning a Substrate,"
- U.S. patent application Ser. No. 11/532,493, filed on Sep. 15, 2006, entitled "Apparatus and System for Cleaning a Substrate," and
- U.S. patent application Ser. No. 11/641,362, filed on Dec. 18, 2006, entitled "Substrate Preparation Using Stabilized Fluid Solutions and Methods for Making Stable Fluid Solutions,"
- U.S. patent application Ser. No. 12/212,579, filed on Sep. 17, 2008, entitled
"Method and Apparatus for Removing Contaminants from Substrate."

The disclosure of each above-identified related application is incorporated herein by reference.

BACKGROUND

In the fabrication of semiconductor devices such as integrated circuits, memory cells, and the like, a series of manufacturing operations are performed to define features on semiconductor wafers ("wafers"). The wafers (or substrates) include integrated circuit devices in the form of multi-level structures defined on a silicon substrate. At a substrate level, transistor devices with diffusion regions are formed. In subsequent levels, interconnect metallization lines are patterned and electrically connected to the transistor devices to define a desired integrated circuit device. Also, patterned conductive layers are insulated from other conductive layers by dielectric materials.

During the series of manufacturing operations, the wafer surface is exposed to various types of contaminants. Essentially any material present in a manufacturing operation is a potential source of contamination. For example, sources of contamination may include process gases, chemicals, deposition materials, and liquids, among others. The various contaminants may deposit on the wafer surface in particulate form. If the particulate contamination is not removed, the devices within the vicinity of the contamination will likely be inoperable. Thus, it is necessary to clean contaminants from the wafer surface in a substantially complete manner without damaging the features defined on the wafer. However, the size of particulate contamination is often on the order of the critical dimension size of features fabricated on the wafer. Removal of such small particulate contamination without adversely affecting the features on the wafer can be quite difficult.

SUMMARY

In one embodiment, a method is disclosed for cleaning a substrate. The method includes an operation for performing a first application of a cleaning material to a surface of a substrate. The cleaning material includes one or more viscoelastic materials for entrapping contaminants present on the surface of the substrate. The method continues with an operation for performing a first application of a rinsing fluid to the surface of the substrate so as to rinse the cleaning material from the surface of the substrate. The first application of the rinsing fluid is also performed to leave a residual thin film of the rinsing fluid on the surface of the substrate. The method also includes an operation for performing a second application of the cleaning material to the surface of the substrate, such that the second application of the cleaning material is applied to the surface of the substrate having the residual thin film of rinsing fluid present thereon. The method then continues with an operation for performing a second application of the rinsing fluid to the surface of the substrate so as to rinse the cleaning material from the surface of the substrate.

In another embodiment, a method is disclosed for cleaning a substrate. The method includes moving a substrate to be cleaned under a first processing head. The first processing head is operated to dispense a cleaning material over the substrate as the substrate is moved under the first processing head. The cleaning material includes one or more viscoelastic materials for entrapping contaminants present on the substrate. The first processing head is operated to rinse the substrate following the dispensing of the cleaning material on the substrate, so as to leave a residual thin film of the rinsing fluid on the substrate as the substrate emerges from under the first processing head. The method also includes moving the substrate having the residual thin film of the rinsing fluid thereon under a second processing head. The second processing head is operated to dispense the cleaning material over the substrate such that the cleaning material contacts the residual thin film of rinsing fluid present on the substrate. The second processing head is also operated to rinse the substrate following the dispensing of the cleaning material on the substrate by the second processing head.

In another embodiment, an apparatus for cleaning a substrate is disclosed. The apparatus includes a substrate carrier defined to move a substrate in a substantially linear path while maintaining the substrate in a substantially horizontal orientation. The apparatus also includes a first processing head positioned over the path of the substrate. The first processing head is defined to dispense a cleaning material over the substrate, dispense a rinsing fluid on the substrate, and remove the rinsing fluid and cleaning material from the substrate so as to leave a residual thin film of the rinsing fluid on the substrate. The apparatus further includes a second processing head positioned over the path of the substrate behind the first processing head relative to a direction of travel of the substrate carrier. The second processing head is defined to dispense the cleaning material over the substrate such that the cleaning material is made to contact the residual thin film of rinsing fluid present on the substrate. The second processing head is also defined to dispense a rinsing fluid on the substrate and remove the rinsing fluid and cleaning material from the substrate. The cleaning material dispensed by each of the first and second processing heads includes one or more viscoelastic materials for entrapping contaminants present on the substrate.

Other aspects and advantages of the invention will become more apparent from the following detailed description, taken in conjunction with the accompanying drawings, illustrating by way of example the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

A method and apparatus is disclosed herein for cleaning contaminant particles from a substrate. The method includes a multi-stage application of a cleaning material to a surface of the substrate to be cleaned. In one embodiment, two stages of cleaning material application and rinsing are utilized. However, it should be understood that other embodiments may utilize more than two stages of cleaning material application and rinsing. The cleaning material applied in each of the multiple stages is defined to entrap contaminant particles present on the substrate. A rinsing fluid is applied to the substrate surface at each of the multiple stages to remove the cleaning material along with the contaminant particles trapped within the cleaning material. A thin film of rinsing fluid is allowed to remain on the substrate surface as the substrate travels between the multiple stages. An interaction between the cleaning material and the remaining rinsing fluid present on the surface of the substrate enhances particle removal efficiency (PRE).

A substrate, as referenced herein, denotes without limitation, semiconductor wafers, hard drive disks, optical discs, glass substrates, Out panel display surfaces, liquid crystal display surfaces, etc., which may become contaminated during manufacturing or handling operations. Depending on the actual substrate, a surface may become contaminated in different ways, and the acceptable level of contamination is defined in the particular industry in which the substrate is handled. For ease of discussion, substrate contamination is described herein by a presence of contaminant particles on the substrate surface. However, it should be understood that contaminant particles as referenced herein may take the form of essentially any type of contaminant that may contact a substrate during essentially any substrate processing and handling operation.

In various embodiments, the method and apparatus disclosed herein can be used for cleaning contaminant particles from patterned substrates and non-patterned substrates alike. In the case of patterned substrates, protruding structures on the patterned substrate surface to be cleaned may correspond to protruding lines, such as polysilicon lines or metal lines. Additionally, the patterned substrate surface to be cleaned may include recessed features, such as recessed vias resulting from a chemical mechanical planarization (CMP) process.

Figure 1A:
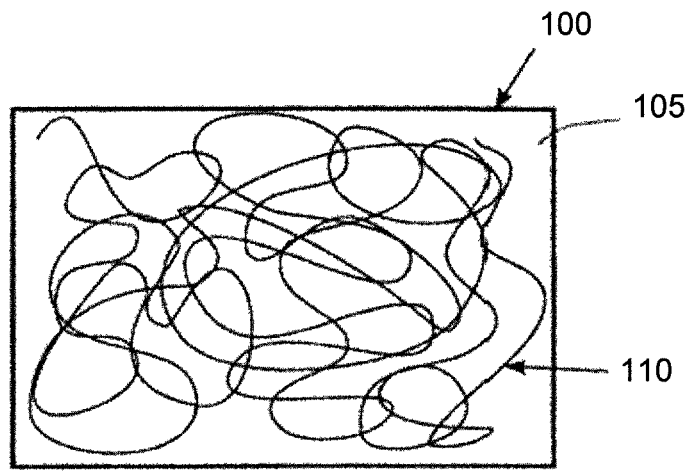
FIG. 1A shows a liquid cleaning material which includes a cleaning solution having a viscoelastic material distributed therein, in accordance with one embodiment of the present invention.

FIG. 1A shows a liquid cleaning material 100 which includes a cleaning solution 105 having a viscoelastic material distributed therein, in accordance with one embodiment of the present invention. In one example embodiment, the viscoelastic material is defined by polymers 110 of large molecular weight. In another example embodiment, the liquid cleaning material 100 is a gel-like polymer. In yet another example embodiment, the liquid cleaning material 100 is a sol, i.e., a colloidal suspension of solid particles in a liquid. In yet another embodiment, the liquid cleaning material 100 is a liquid solution. The liquid cleaning material 100 is defined to remove contaminant particles from a substrate when applied thereto.

Figure 1B:
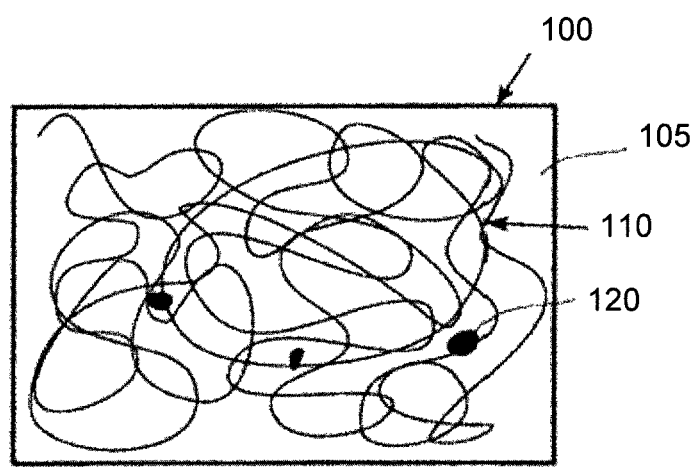
FIG. 1B shows a number of contaminant particles entrapped within the viscoelastic components of the liquid cleaning material, in accordance with one embodiment of the present invention.

FIG. 1B shows a number of contaminant particles 120 entrapped within the viscoelastic components 110 of the liquid cleaning material 100, in accordance with one embodiment of the present invention. In one embodiment, the viscoelastic components 110 are polymers of large molecular weight (e.g., of molecular weight greater than 10,000 g/mol) that form long polymer chains. These long polymer chains become intertwined with each other to form a polymeric network which functions to entrap contaminant particles on the surface of the substrate and to prevent the entrapped contaminant particles from returning to the surface of the substrate once removed therefrom.

Figure 1C:
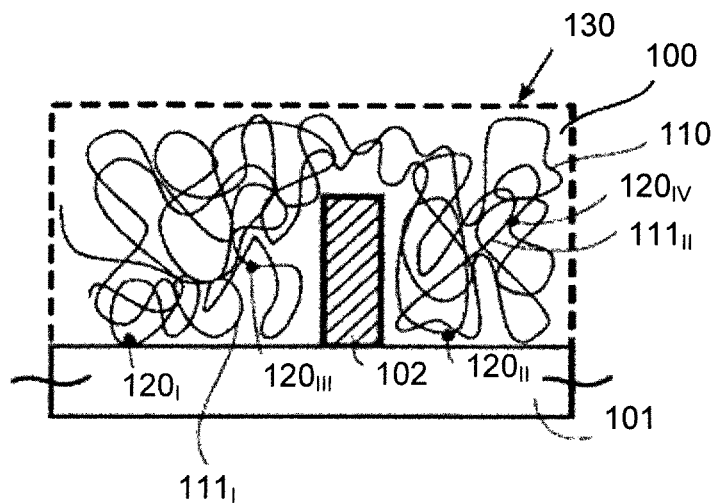
FIG. 1C illustrates how the viscoelastic components in the cleaning material can slide around device structures without exerting a damaging force on the device structures.

The viscoelastic components 110 are dissolved in the cleaning solution 105. The cleaning solution 105 includes elements that affect the pH value and enhance the solubility of the viscoelastic components 110. The viscoelastic components 110 dissolved in the cleaning solution 105 can be a soft gel or become gel-like droplets suspended in the cleaning solution 105. Also, in one embodiment, multiple types of viscoelastic components 110 can be simultaneously dissolved in the cleaning solution 105. In one embodiment, the contaminants on the substrate surface attach to the solvated viscoelastic components 110 by ionic force, van der Waals force, electrostatic force, hydrophobic interaction, steric interaction, or chemical bonding. Therefore, when the viscoelastic components 110 are placed within an interaction range about the contaminants, the viscoelastic components 110 capture and entrap the contaminants. Additionally, the liquid cleaning material 100 is formulated to be gentle on device structures present on the substrate during the cleaning process. For example, as shown in FIG. 1C, the viscoelastic components 110 in the cleaning material 100 can slide around device structures 102 without exerting a damaging force on the device structures 102.

Examples of the viscoelastic material having polymers of large molecular weight include, but are not limited to: a) acrylic polymers such as polyacrylamide (PAM), b) polyacrylic acid (PAA) such as Carbopol 940™ and Carbopol 941™, c) poly-(N,N-dimethyl-acrylamide) (PDMAAm), d) poly-(N-isopropyl-acrylamide) (PIPAAm), e) poly-methacrylic acid (PMAA), f) polymethacrylamide (PMAAm), g) polyimines and oxides such as polyethylene imine (PEI), polyethylene oxide (PEO), polypropylene oxide (PPO) etc., h) vinyl polymers such as polyvinyl alcohol (PVA), polyethylene sulphonic acid (PESA), polyvinylamine (PVAm), polyvinyl-pyrrolidone (PVP), poly-4-vinyl pyridine (P4VP), etc., i) cellulose derivatives such as methyl cellulose (MC), ethyl-cellulose (EC), hydroxyethyl cellulose (HEC), carboxymethyl cellulose (CMC), etc., j) polysaccharides such as acacia (Gum Arabic), agar and agarose, heparin, guar gum, xanthan gum, etc., k) proteins such as albumen, collagen, gluten, etc.

With regard to exemplary viscoelastic component 110 structures, polyacrylamide (PAM) is an acrylate polymer ($—CH_2CHCONH_2—$)n formed from acrylamide subunits, wherein "n" is an integer. Polyvinyl alcohol (PVA) is a polymer ($—CH_2CHOH—$)m formed from vinyl alcohol subunits, where "m" is an integer. Polyacrylic acid (PAA) is a polymer ($—CH_2=CH—COOH—$)o formed from acrylic acid subunits, where "o" is an integer. The viscoelastic component 110 of large molecular weight in the viscoelastic material is either soluble in an aqueous solution or is highly water-absorbent so as to form a soft gel in an aqueous solution. The viscoelastic components 110 can dissolve in the cleaning solution, be dispersed completely in the cleaning solution, form liquid droplets (emulsify) in the cleaning solution, or form lumps in the cleaning solution.

In one embodiment, the molecular weight of the viscoelastic material is greater than 100,000 g/mol. In another embodiment, the molecular weight of the viscoelastic material is within a range extending from about 0.1M g/mol to about 100M g/mol. In another embodiment, the molecular weight of the viscoelastic compound is within a range extending from about 1M g/mol to about 20M g/mol. In yet another embodiment, the molecular weight of the viscoelastic compound is within a range extending from about 15M g/mol to about 20M g/mol.

In one embodiment, the weight percentage of the viscoelastic components 110 in the cleaning material 100 is within a range extending from about 0.001% to about 20%. In another embodiment, the weight percentage of the viscoelastic components 110 in the cleaning material 100 is within a range extending from about 0.001% to about 10%. In another embodiment, the weight percentage of the viscoelastic components 110 in the cleaning material 100 is within a range extending from about 0.01% to about 10%. In yet another embodiment, the weight percentage of the viscoelastic components 110 in the cleaning material 100 is within a range extending from about 0.05% to about 5%.

Alternatively, the viscoelastic components 110 can be copolymers, which are derived from two or more monomeric species. For example, the copolymer molecules can include 90% of acrylamide (AM) and 10% of acrylic acid (AA). In addition, the viscoelastic components 110 can be a mixture of two or more types of polymers. For example, the viscoelastic components 110 can be made by mixing two types of polymers, such as 90% of PAM and 10% of PAA, in the solvent.

In the exemplary embodiments of FIGS. 1A-1C, the viscoelastic components 110 are dissolved uniformly in the cleaning solution 105. The base liquid, or solvent, of the cleaning solution 105 can be a non-polar liquid, such as turpentine, or a polar liquid such as water ($H_2O$). Other examples of solvent include isopropyl alcohol (IPA), dimethyl sulfoxide (DMSO), and dimethyl formamide (DMF). In one embodiment, the solvent is a mixture of two or more liquids. For viscoelastic components 110 with polarity, such as PAM, PAA, or PVA, the suitable solvent for the cleaning solution 105 is a polar liquid, such as water ($H_2O$).

In another embodiment, the cleaning solution 105 includes compounds other than the solvent, such as water, so as to modify the properties of the cleaning material 100. For example, the cleaning solution 105 can include a buffering agent, which can be a weak acid or a weak base, to adjust the potential of hydrogen (pH) value of the cleaning solution 105 and corresponding cleaning material 100. One example of the weak acid is citric acid. One example of the weak base is ammonium ($NH_4OH$). The pH value of the cleaning material 100 can range from about 1 to about 12. In one embodiment, for front-end applications (before the deposition of copper and inter-metal dielectric), the cleaning material 100 is basic with a pH value within a range extending from about 7 to about 12. In another embodiment, the pH value for front-end applications is within a range extending from about 8 to about 11. In yet another embodiment, the pH value for front-end applications is within a range extending from about 8 to about 10.

In one embodiment, for backend processing (after deposition of copper and inter-metal dielectric), the cleaning solution can be slightly basic, neutral, or acidic. In one embodiment, the pH value for backend applications is within a range extending from about 1 to about 7. In another embodiment, the pH value for backend applications is within a range extending from about 1 to about 5. In yet another embodiment, the pH value for backend applications is within a range extending from about 1 to about 2.

In one embodiment, the cleaning solution includes a surfactant, such as ammonium dodecyl sulfate (ADS) or sodium dodecyl sulfate (SDS), to assist with dispersion of the viscoelastic components 110 in the cleaning solution 105. In one embodiment, the surfactant also assists with wetting of the cleaning material 100 on the substrate surface. Wetting of the cleaning material 100 on the substrate surface allows the cleaning material 100 to come in close contact with the substrate surface and the contaminant particles thereon. Wetting also improves cleaning efficiency. Also, other additives can be added to improve surface wetting, substrate cleaning, rinsing, and other related properties.

In one embodiment, the cleaning solution 105 is formulated as a buffered solution. For example, the cleaning solution 105 may be defined as a buffered ammonium solution (BAS), which includes basic and acidic buffering agents, such as 0.44 wt % (weight percent) of $NH_4OH$ and 0.4 wt % of citric acid. Moreover, the buffered cleaning solution, such as BAS, can include some amount of surfactant, such as 1 wt % of ADS or SDS, to assist with suspension and dispersion of the viscoelastic components 110 in the cleaning solution 105. A cleaning solution 105 that contains 1 wt % of ADS or SDS, 0.44 wt % of NH3, and 0.4 wt % of citric acid is referred to herein as a solution "S100". Both solution "S100" and BAS have a pH value of about 10.

Figure 1D:
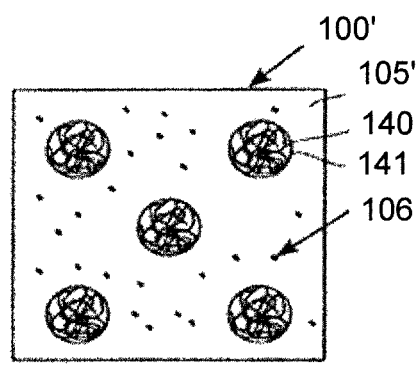
FIG. 1D shows a liquid cleaning material with gel-like viscoelastic component droplets emulsified in the cleaning solution, in accordance with one embodiment of the present invention.

FIG. 1D shows a liquid cleaning material 100' with gel-like viscoelastic component droplets 140 emulsified in the cleaning solution 105', in accordance with one embodiment of the present invention. The cleaning solution 105' can also contain small and isolated viscoelastic components 106. A surfactant, such as ADS or SDS, can be added to the cleaning solution 105' to assist with uniform dispersion of the gel-like viscoelastic component droplets 140 throughout the cleaning solution 105'. In the exemplary embodiment of FIG. 1D, a boundary 141 occurs between the cleaning solution 105' and the gel-like viscoelastic component droplets 140. The gel-like viscoelastic component droplets 140 are soft and deform around device features on the substrate surface. Because the gel-like viscoelastic component droplets 140 deform around device features, they do not exert damaging forces on the device features. In one embodiment, diameters of the gel-like viscoelastic component droplets 140 are within a range extending from about 0.1 μm (micrometer) to about 100 μm.

Figure 1E:
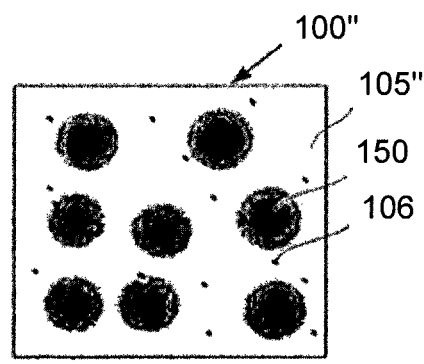
FIG. 1E shows a liquid cleaning material with a viscoelastic material dissolved in a cleaning solution to form gel-like viscoelastic component lumps, which do not have distinct boundaries within the cleaning solution, in accordance with one embodiment of the present invention.

FIG. 1E shows a liquid cleaning material 100" with viscoelastic components dissolved in a cleaning solution 105" to form gel-like viscoelastic component lumps 150, which do not have distinct boundaries within the cleaning solution 105", in accordance with one embodiment of the present invention. The cleaning solution 105" can also contain small and isolated viscoelastic components 106. The gel-like viscoelastic component lumps 150 are soft and deform around device features on the substrate surface, and do not exert damaging forces on the device features. In one embodiment, diameters of the viscoelastic component lumps 150 are within a range extending from about 0.1 μm to about 100 μm.

Figure 1F:
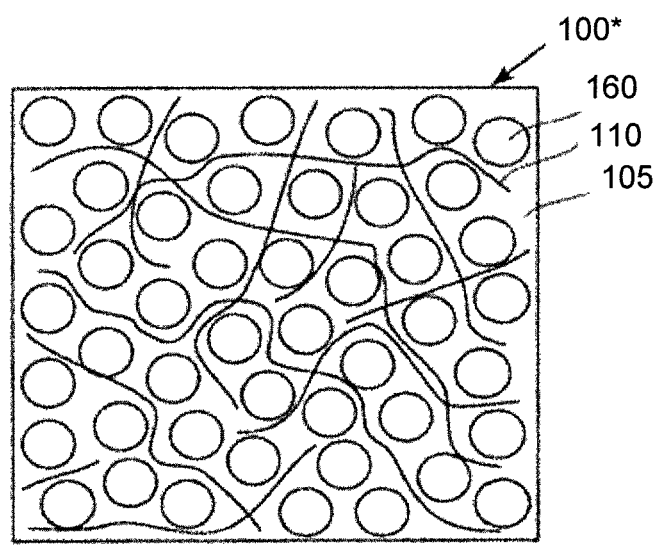
FIG. 1F shows a cleaning material having air bubbles dispersed within the cleaning solution, in accordance with one embodiment of the present invention.

The cleaning materials 100, 100', and 100" discussed above are all in liquid phase. In yet another embodiment, the cleaning materials 100, 100', and 100" can be agitated through addition of a gas, such as $N_2$, an inert gas, or a mixture of gases, such as air, to transform the cleaning materials 100, 100', and 100" into a foam. FIG. 1F shows a cleaning material 100* having air bubbles 160 dispersed within the cleaning solution 105, in accordance with one embodiment of the present invention. The cleaning material can include viscoelastic component chains 110, viscoelastic component droplets 140, or viscoelastic component lumps 150, or a combination thereof. It should be appreciated that the cleaning material 100* includes both a gas phase portion and a liquid phase portion.

As shown in FIG. 1A-1C, long chains of the high molecular weight viscoelastic components 110 form a network, which may or may not include viscoelastic component cross-linking. As shown in FIG. 1C, the viscoelastic components 110 come in contact with the contaminant particles (such as contaminant particles $120_I$ and $120_{II}$) on the substrate surface and entrap the contaminant particles. Upon removal of the contaminant particles from the substrate surface, the contaminant particles are suspended in the cleaning material 100 by way of the network of viscoelastic components 110. For example, FIG. 1C shows contaminant particles $120_{III}$ and $120_{IV}$ suspended in the cleaning material 100 by way of attachment to the viscoelastic component chains $111_I$ and $111_{II}$, respectively. It should be understood that any contaminant particle can be attached to multiple viscoelastic component chains within the viscoelastic component network.

As discussed above, contaminant particles on the substrate become entrapped within the viscoelastic component chains/network of the cleaning material 100. Contaminant particles entrapped within the cleaning material 100 are removed from the substrate when the cleaning material 100 is removed from the substrate by way of rinsing. Specifically, a rinsing fluid is applied to the substrate to remove the cleaning material 100 and contaminants entrapped therein. The rinsing fluid material should be chemically compatible with the cleaning material 100 and with the substrate to be cleaned. In one embodiment, the rinsing fluid is deionized water (DIW). However, in other embodiments, the rinsing fluid can be one of many different materials in liquid state, such as dimethyl sulfoxide (DMSO), dimethyl formamide (DMF), dimethyl acetate (DMAC), a polar solvent easy mixable with DIW, an atomized liquid such as an atomized polar solvent (e.g., DIW), or any combination thereof. It should be understood that the above-identified rinsing fluid materials are provided by way of example and do not represent an inclusive set of rinsing fluid materials.

Figure 2A:
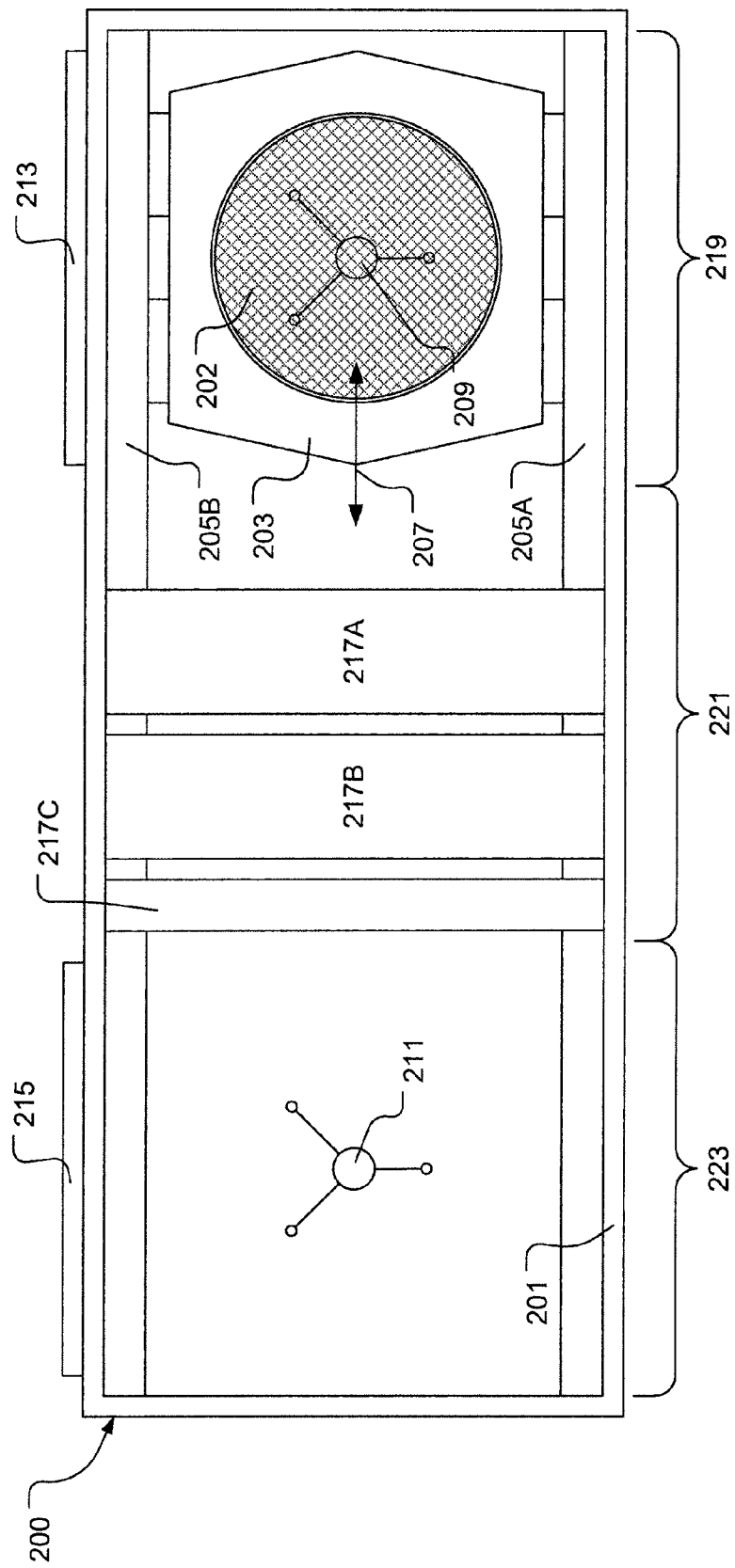
FIG. 2A shows a system for cleaning contaminants from a substrate, in accordance with one embodiment of the present invention.

FIG. 2A shows a system for cleaning contaminants from a substrate, in accordance with one embodiment of the present invention. The system includes a chamber 200 defined by enclosing walls 201. The chamber 200 includes an input module 219, a processing module 221, and an output module 223. A substrate carrier 203 and corresponding drive apparatus is defined to provide linear movement of a substrate 202 from the input module 219, through the processing module 221, to the output module 223, as indicated by arrow 207. A drive rail 205A and a guide rail 205B are defined to provide for controlled linear movement of the substrate carrier 203, such that the substrate 202 is maintained in a substantially horizontal orientation along a linear path defined by the drive rail 205A and guide rail 205B.

The input module 219 includes a door assembly 213 through which the substrate 202 can be inserted into the chamber 200 by a substrate handling device. The input module 219 also includes a substrate lifter 209 defined to move vertically through an open region of the substrate carrier 203, when the substrate carrier 203 is centered thereover in the input module 219. The substrate lifter 209 can be raised to receive the substrate 202 when inserted into the chamber 200 through the door assembly 213. The substrate lifter 209 can then be lowered to place the substrate 202 on the substrate carrier 203 and clear the linear travel path of the substrate carrier 203.

The processing module 221 includes a number of processing heads 217A-217C disposed to process the substrate 202 as the substrate carrier 203, with the substrate 202 positioned thereon, moves beneath the processing heads 217A-217C. The processing module 221 can also include additional lower processing heads disposed below the linear travel path of the substrate carrier 203, such that the lower processing heads are defined and positioned to process a bottom surface of the substrate 202 as the substrate carrier 203 moves through the processing module 221. As discussed in more detail below, with regard to the present invention, processing heads 217A and 217B are defined to perform a multi-stage cleaning material application and rinsing process on the top surface of the substrate 202. Additionally, in one embodiment, processing head 217C is defined to perform a drying process on the top surface of the substrate 202 after the multi-stage cleaning process is performed by the processing heads 271A and 217B.

Once the substrate carrier 203 moves through the processing module 221, the substrate carrier 203 arrives at the output module 215. The output module 215 includes a substrate lifter 211 defined to move vertically through the open region of the substrate carrier 203, when the substrate carrier 203 is centered thereover in the output module 211. The substrate lifter 211 can be raised to lift the substrate 202 from the substrate carrier 203 to a position for retrieval from the chamber 200. The output module 211 also includes a door assembly 215 through which the substrate 202 can be retrieved from the chamber 200 by a substrate handling device. Once the substrate 202 is retrieved off of the substrate lifter 211, the substrate lifter 211 can be lowered to clear the linear travel path of the substrate carrier 203. Then, the substrate carrier 203 is moved back to the input module 219 to retrieve the next substrate for processing.

Figure 2B:
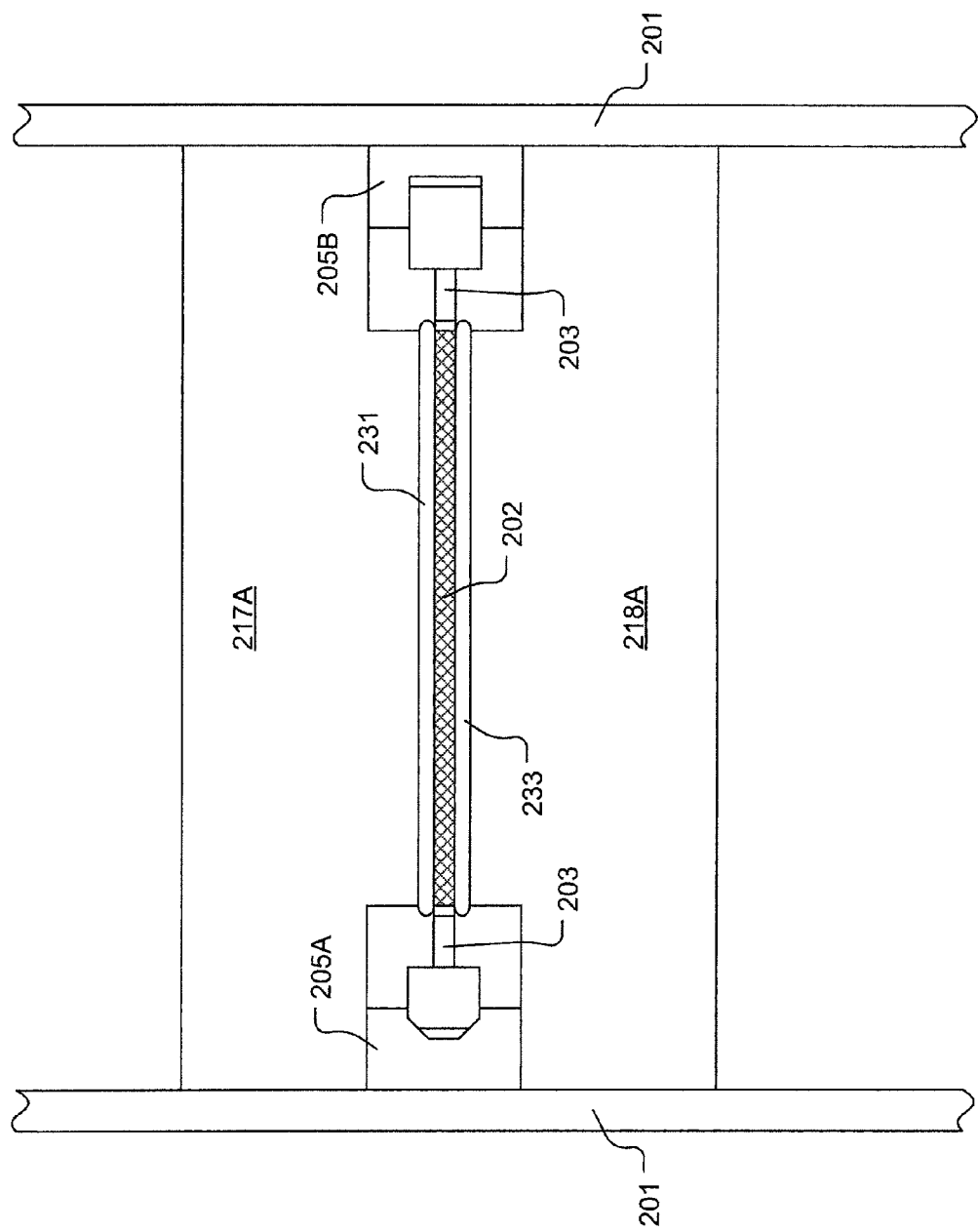
FIG. 2B shows a vertical cross-section view of the chamber with the substrate carrier located beneath the processing head and above a lower processing head, in accordance with one embodiment of the present invention.

FIG. 2B shows a vertical cross-section view of the chamber 200 with the substrate carrier 203 located beneath the processing head 217A and above a lower processing head 218A, in accordance with one embodiment of the present invention. The processing head 217A is mounted to both the drive rail 205A and the guide rail 205B, such that a vertical position of the processing head 217A is indexed to both a vertical position of the drive rail 205A and a vertical position of the guide rail 205B, and is thereby indexed to a vertical position of the substrate carrier 203 and substrate 202 held thereon.

The processing head 217A is defined to expose the top surface of the substrate 202 present on the substrate carrier 203 to a processing fluid 231. In some embodiments, the processing head 217A is defined to dispense a meniscus of processing fluid 231 onto the top surface of the substrate 202 as the substrate 202 traverses beneath the processing head 217A. Similarly, the lower processing head 218A is defined to expose the bottom surface of the substrate 202 present on the substrate carrier 203 to a processing fluid 233. Also, in some embodiments, the processing head 218A is defined to dispense a meniscus of processing fluid 233 onto the bottom surface of the substrate 202 as the substrate 202 traverses beneath the processing head 218A. In various embodiments, each of the processing heads within the processing module 221 (e.g., processing heads 217A and 217B) can be defined to perform one or multiple substrate processing operations on the substrate 202. Additionally, in one embodiment, the processing heads within the processing module 221 are defined to span a diameter of the substrate 202, such that one pass of the substrate carrier 203 under/over the upper/lower processing heads will process an entirety of the top/bottom surface of the substrate 202.

Figure 2C:
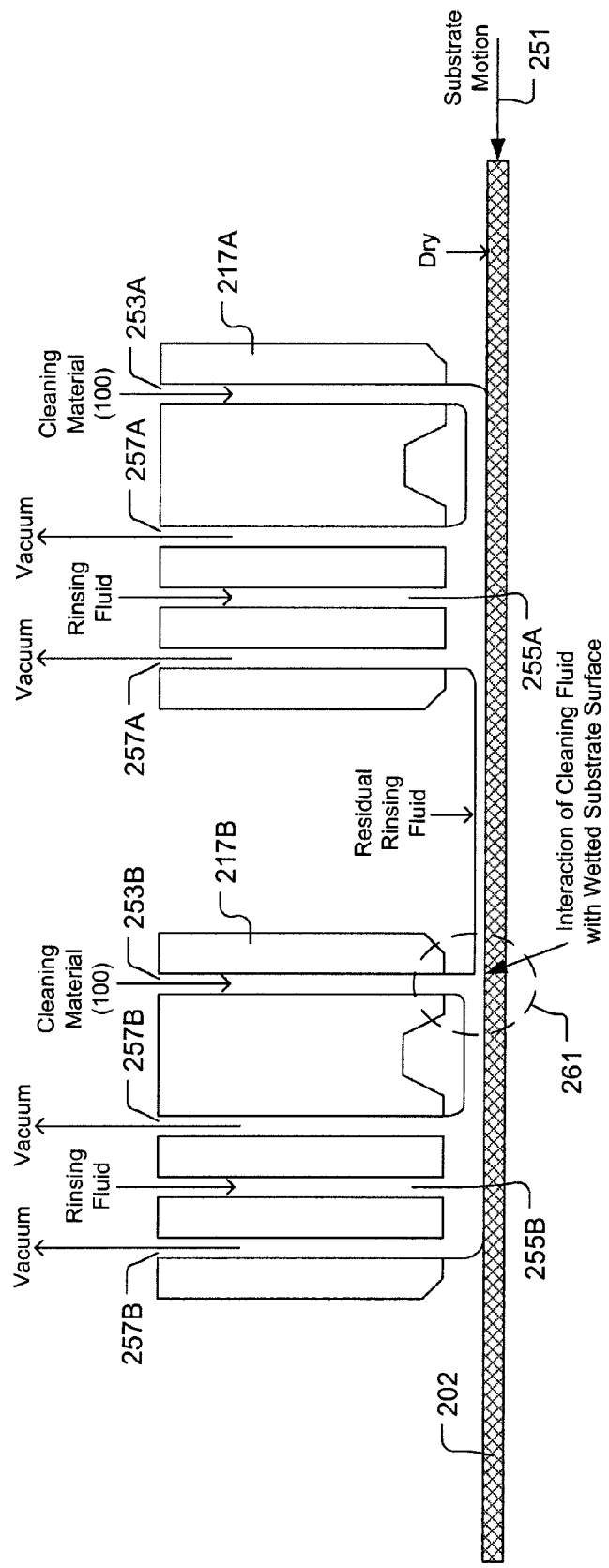
FIG. 2C shows the two processing heads positioned to provide the multi-stage application of the cleaning material to the top surface of the substrate, in accordance with one embodiment of the present invention.

The present invention includes a multi-stage application of the cleaning material 100 to the top surface of the substrate 202. FIG. 2C shows the two processing heads 217A and 217B positioned to provide the multi-stage application of the cleaning material 100 to the top surface of the substrate 202, in accordance with one embodiment of the present invention. Although, the present exemplary embodiment, utilizes two processing heads 217A and 217B, it should be understood that other embodiments may utilized more than two processing heads to provide successive application/removal of the cleaning material 100 to/from the top surface of the substrate 202.

The substrate 202 is moved beneath the processing heads 217A and 217B in the direction indicated by arrow 251. The first processing head 217A includes a channel 253A from which the cleaning material 100 is applied to the substrate 202 top surface. In this embodiment, the substrate 202 top surface is substantially dry when entering the region beneath the first processing head 217A. Therefore, the first processing head 217A applies the cleaning material 100 to a substantially dry substrate 202 top surface. The first processing head 217A is further defined to supply a rinsing fluid, such as deionized water (DIW), through a rinsing fluid supply channel 255A and remove the rinsing fluid and cleaning material 100 through a vacuum channel 257A. A suction provided by the vacuum channel 257A is controlled to maintain a substantially confined fluid meniscus beneath the first processing head 217A. However, the suction provided by the vacuum channel 257A is also controlled to leave a thin film of residual rinsing fluid on the substrate 202 top surface. Thus, the substrate 202 top surface is wetted when emerging from beneath the first processing head 217A.

In one embodiment, the thickness of the thin film of residual rinsing fluid left on the substrate 202 top surface following traversal of the substrate 202 beneath the first processing head 217A is controlled within a range extending from about 0.01 millimeter) to about 5 mm. In another embodiment, the thickness of the thin film of residual rinsing fluid left on the substrate 202 top surface following traversal of the substrate 202 beneath the first processing head 217A is controlled within a range extending from about 0.05 mm to about 2 mm. In yet another embodiment, the thickness of the thin film of residual rinsing fluid left on the substrate 202 top surface following traversal of the substrate 202 beneath the first processing head 217A is controlled within a range extending from about 0.1 to about 1 mm. In one embodiment, an average thickness of the thin film of residual rinsing fluid left on the substrate 202 top surface following traversal of the substrate 202 beneath the first processing head 217A is about 0.3 mm. However, this average thickness may vary within a range extending from about 0.1 mm to about 1 mm, due to substrate 202 bowing, first processing head 217A bowing, and geometrical characteristics of the substrate carrier 203 and associated components.

In one embodiment, the rinsing fluid is applied through the first processing head 217A with a sufficiently high flow rate and force so as to provide substantially complete removal of the cleaning material 100 from the top surface of the substrate 202. Therefore, in this embodiment, the fluid remaining on the wetted top surface of the substrate 202 upon emerging from beneath the first processing head 217A is primarily comprised of the rinsing fluid, with possible minor remnants of the cleaning material 100.

Following traversal beneath the first processing head 217A, the substrate 202 continues toward and passes beneath the second processing head 217B. In one embodiment, the second processing head 217B is identical in structure to the first processing head 217A. Therefore, the second processing head 217B includes a channel 253B from which the cleaning material 100 is applied to the wetted top surface of the substrate 202. The second processing head 217B is further defined to supply a rinsing fluid, such as deionized water (DIW), through a rinsing fluid supply channel 255B and remove the rinsing fluid and cleaning material 100 through a vacuum channel 257B.

A suction provided by the vacuum channel 257B is controlled to maintain a substantially confined fluid meniscus beneath the second processing head 217B. In one embodiment, the suction provided by the vacuum channel 257B is also controlled to remove both the cleaning material 100 and rinsing fluid from the top surface of the substrate 202 in a substantially complete manner. In another embodiment, the suction provided by the vacuum channel 257B may allow the top surface of the substrate 202 to emerge from beneath the second processing head 217B with a residual amount of rinsing fluid on the substrate 202. In this embodiment, a third processing head, such as processing head 217C of FIG. 2A, may be provided to dry the top surface of the substrate 202.

An unexpected result associated with placing the first and second processing heads 217A and 217B in immediate succession, as illustrated in FIGS. 2A-2D, is that the particle removal efficiency (PRE) of the cleaning material 100 when applied to the wetted substrate 202 at the interface region 261 is found to be comparable to the PRE achieved when the cleaning material 100 is applied to a dry substrate 202 and then subsequently rinsed. For example, despite the potential for dilution of the cleaning material 100 at the interface 261, application of the cleaning material 100 to the wetted substrate 202 at the interface 261 still provides an unexpectedly high PRE. This finding is considered important because it allows for placement of multiple processing heads for cleaning material 100 deposition/rinsing, such as 217A and 217B, in immediate succession without requiring that the substrate 202 be dried between passes under the processing heads. It should be appreciated that placement of a processing head for drying between each successive processing head for cleaning material 100 deposition/rinsing would increase cost of the system and potentially decrease throughput rate of the system.

In one embodiment, the cleaning material 100 dispensed by the second processing head 217B (or further subsequent processing head(s)) displaces the thin film of residual rinsing fluid left on the substrate 202 top surface following traversal of the substrate 202 beneath the first processing head 217A. The displacement mechanism is provided by the high viscosity of the cleaning material 100 relative to the residual rinsing fluid, and the viscoelastic property of the cleaning material 100.

The above-mentioned displacement process can occur in the following manner. The second processing head 217B provides a vertical "curtain" or "wall" of a high viscosity (solid-like) fluid, namely the cleaning material 100. As the substrate 202 approaches the second processing head 217B, the residual rinsing film experiences a high viscous resistance from the vertical curtain of high viscosity fluid dispensed by the second processing head 217B. Instead of remaining on the substrate 202, the residual rinsing fluid accumulates, i.e., backs up, upon encountering the vertical curtain of high viscosity fluid dispensed by the second processing head 217B.

The accumulated residual rinsing fluid is eventually moved from the substrate 202 top surface through a combination of: 1) flow to a lower processing head positioned beneath the substrate 202 traversal path once the substrate carrier 203 and substrate 202 thereon has passed beneath the second processing head 217B, and/or 2) flow to a lower processing head positioned beneath the substrate 202 traversal path through a gap between the substrate 202 peripheral edge and the substrate carrier 203. The viscoelastic property of the cleaning material 100 also contributes to the resistance and displacement applied by the curtain of cleaning material 100 to the residual rinsing fluid, because the cleaning material 100 does not readily mix with the residual rinsing fluid.

Figure 2D:
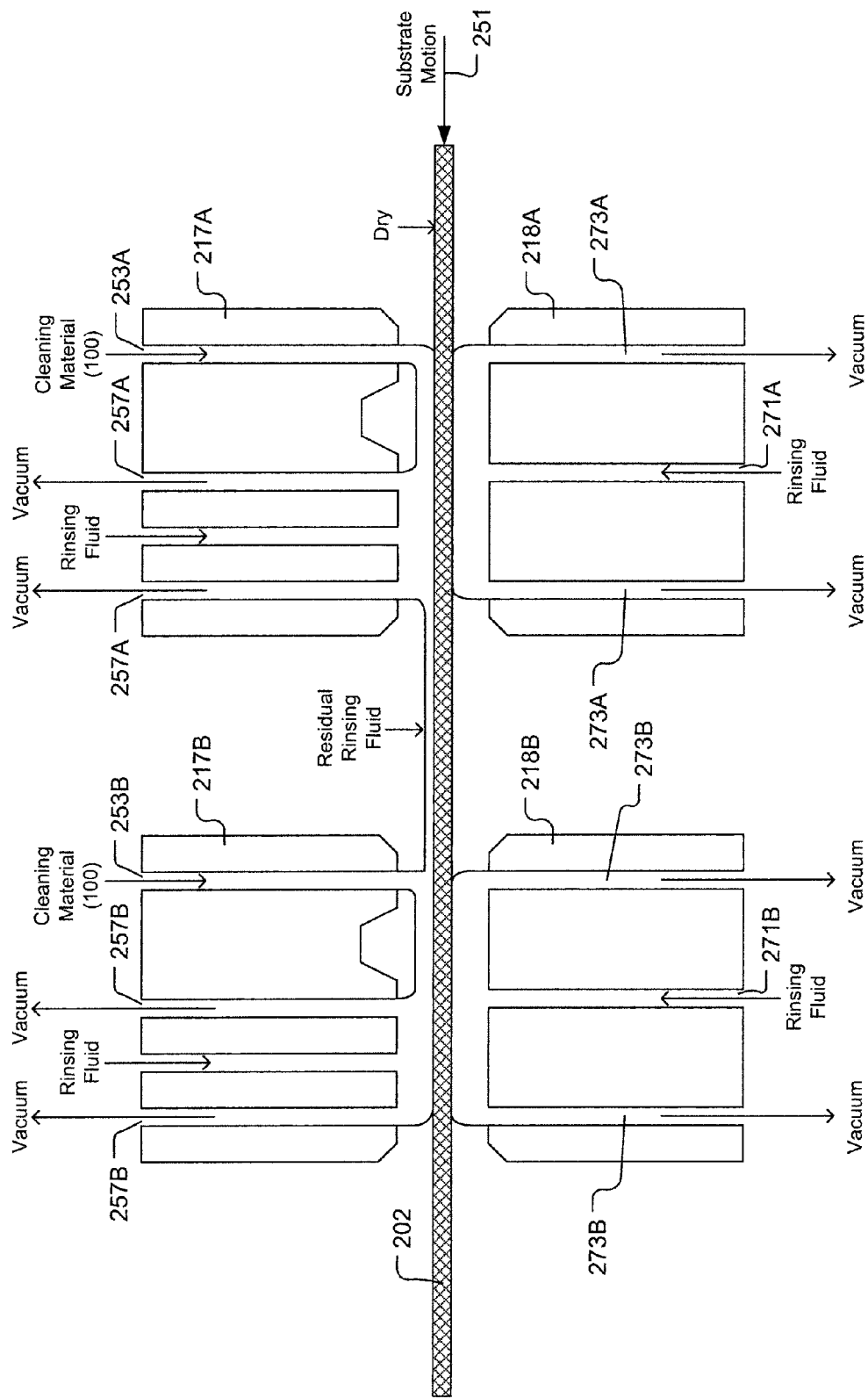
FIG. 2D shows first and second lower processing heads disposed to rinse the bottom surface of the substrate as it passes beneath the first and second upper processing heads, in accordance with one embodiment of the present invention.

However, it should be understood that there may be a small amount of mixing between the cleaning material 100 dispensed from the second processing head 217B and the residual rinsing fluid which encounters the curtain of cleaning material 100. It should also be understood, however, that bulk mixing of the cleaning material 100 and residual rinsing fluid, with corresponding dilution of the cleaning material 100, occurs over a significantly longer time period than an available interaction time between the cleaning material 100 and the rinsing fluid as the substrate 202 traverses beneath the second processing head 217B. Therefore, although a small amount of mixing may occur between the cleaning material 100 and the residual rinsing fluid, the high viscosity of the cleaning material 100 relative to the residual rinsing fluid causes displacement of the residual rinsing fluid by the cleaning material 100 to be the dominant interactive effect. FIG. 2D shows first and second lower processing heads 218A and 218B disposed to rinse the bottom surface of the substrate 202 as it passes beneath the first and second processing heads 217A and 217B, in accordance with one embodiment of the present invention. Each of the first and second lower processing heads 218A and 218B is defined to flow a rinsing fluid through a channel 271A/271B toward the bottom surface of the substrate 202. Also, each of the first and second lower processing heads 218A and 218B is defined to include vacuum channels 273A/273B for removing the rinsing fluid from the bottom surface of the substrate 202.

In one embodiment, the flow rate of rinsing fluid through the channels 271A/271B and the suction provided through the vacuum channels 273A/273B are controlled such that a respective meniscus of rinsing fluid is maintained between each of the lower processing heads 218A and 218B and the bottom surface of the substrate 202. Additionally, it should be appreciated that application of the rinsing fluid to the bottom surface of the substrate 202 at position opposite the substrate 202 from the first and second processing heads 217A and 217B, provides a backing force to the bottom of the substrate 202 in resistance to the force exerted on the top surface of the substrate 202 by the first and second processing heads 217A and 217B.

Figure 2E:
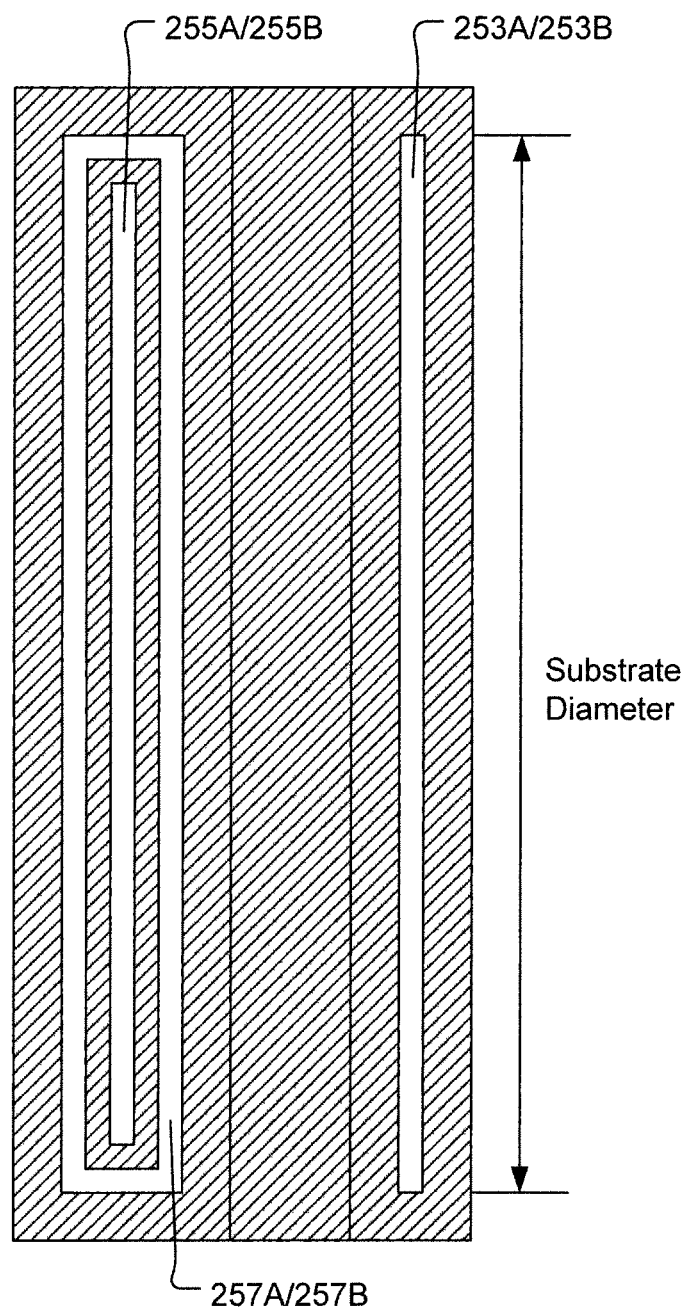
FIG. 2E shows a simplified bottom view of the processing head, in accordance with one exemplary embodiment of the present invention.

The upper first and second processing heads 217A and 217B can be defined in many different ways, so long as each processing head 217A/217B is defined to dispense the cleaning material 100 in a substantially uniform manner across the substrate 202, and provide a subsequent substantially uniform rinsing of the substrate 202. FIG. 2E shows a simplified bottom view of the processing head 217A/217B, in accordance with one exemplary embodiment of the present invention. The channel 253A/253B through which the cleaning material 100 is dispensed is defined to extend a distance at least equal to a diameter of the substrate 202. The channel 255A/255B through which the rinsing fluid is dispensed is defined so as to be surrounded by an annular channel 257A/257B through which the vacuum is applied. Therefore, the rinsing fluid will flow from the channel 255A/255B across the substrate 202 surface and into the annular vacuum channel 257A/257B so as to provide an effective rinsing area that covers a distance at least equal to the diameter of the substrate 202.

Figure 3:
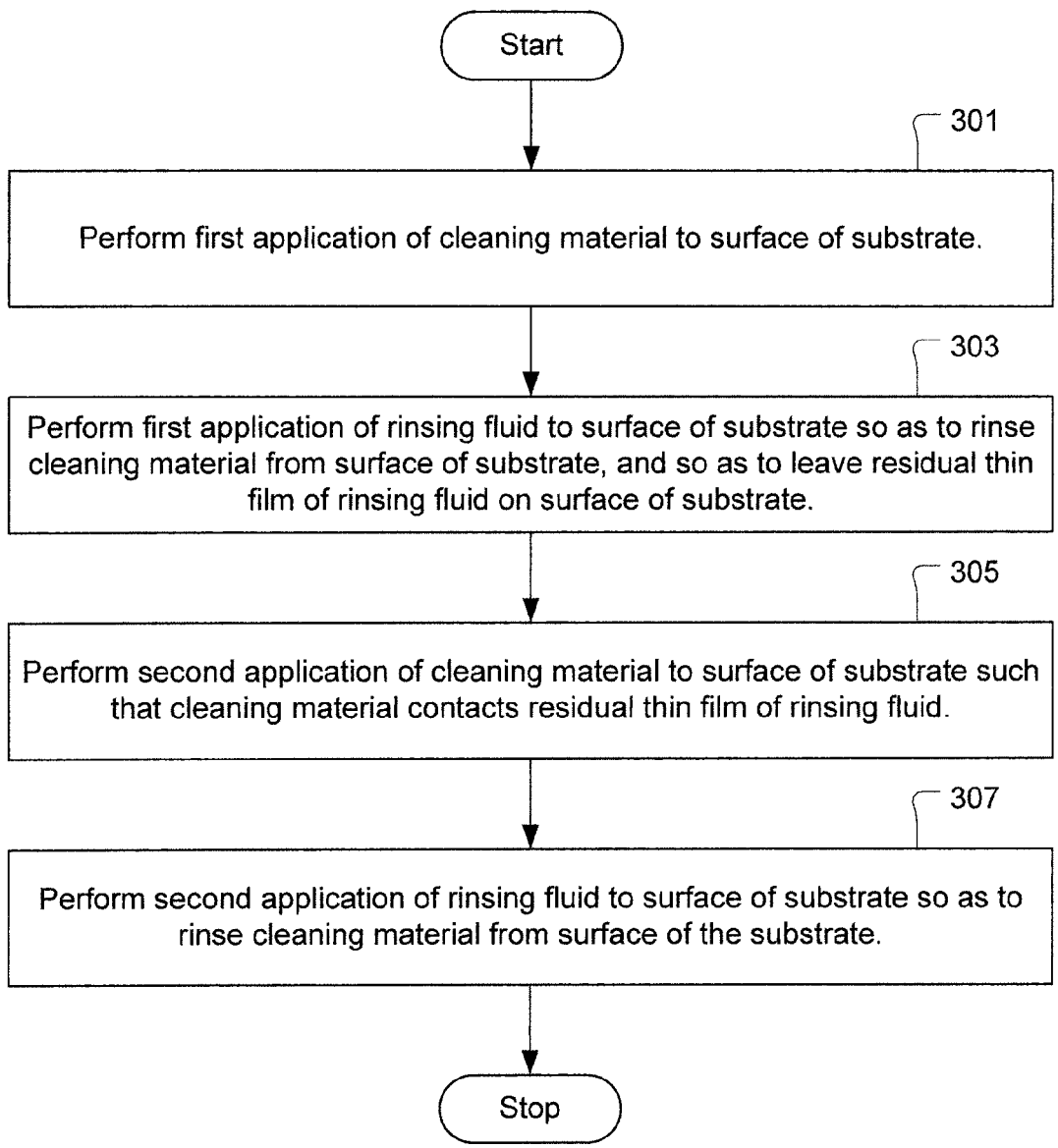
FIG. 3 shows a flowchart of a method for cleaning a substrate, in accordance with one embodiment of the present invention.

FIG. 3 shows a flowchart of a method for cleaning a substrate, in accordance with one embodiment of the present invention. The method includes an operation 301 for performing a first application of a cleaning material to a surface of a substrate. The cleaning material applied in operation 301 includes one or more viscoelastic materials for entrapping contaminants present on the surface of the substrate. In one embodiment, the cleaning material applied in operation 301 corresponds to the cleaning material 100 described above. Therefore, in one embodiment, the cleaning material used in the method is defined as a polar solvent having polyacrylamide dissolved therein.

The method also includes an operation 303 for performing a first application of a rinsing fluid to the surface of the substrate so as to rinse the cleaning material from the surface of the substrate. Application of the rinsing fluid in the operation 303 is also performed so as to leave a residual thin film of the rinsing fluid on the surface of the substrate. In various embodiments, the rinsing fluid used in the method is defined as either deionized water, dimethyl sulfoxide, dimethyl formamide, dimethyl acetate, a polar solvent, an atomized polar solvent, or a combination thereof The first application of the rinsing fluid in operation 303 is performed immediately following the first application of the cleaning material in operation 301.

The method continues with an operation 305 for performing a second application of the cleaning material to the surface of the substrate. It should be understood that operation 305 is performed such that the second application of the cleaning material is applied to the surface of the substrate having the residual thin film of rinsing fluid present thereon. In this manner, the second application of the cleaning material is made to contact the residual thin film of rinsing fluid present on the substrate.

The method further includes an operation 307 for performing a second application of the rinsing fluid to the surface of the substrate so as to rinse the cleaning material from the surface of the substrate. The second application of the rinsing fluid in operation 307 is performed immediately following the second application of the cleaning material in operation 305.

In one embodiment, the method of FIG. 3 includes operating a first processing head to perform both the first application of the cleaning material of operation 301 and the first application of the rinsing fluid of operation 303. Also, in this embodiment, a second processing head is operated to perform both the second application of the cleaning material of operation 305 and the second application of the rinsing fluid of operation 307. Further, in this embodiment, the substrate is moved beneath the first and second processing heads in a successive manner. Additionally, in operation 303 of this embodiment, a vacuum of the first processing head is controlled to leave a controlled thickness of the residual thin film of the rinsing fluid on the surface of the substrate.

Figure 4:
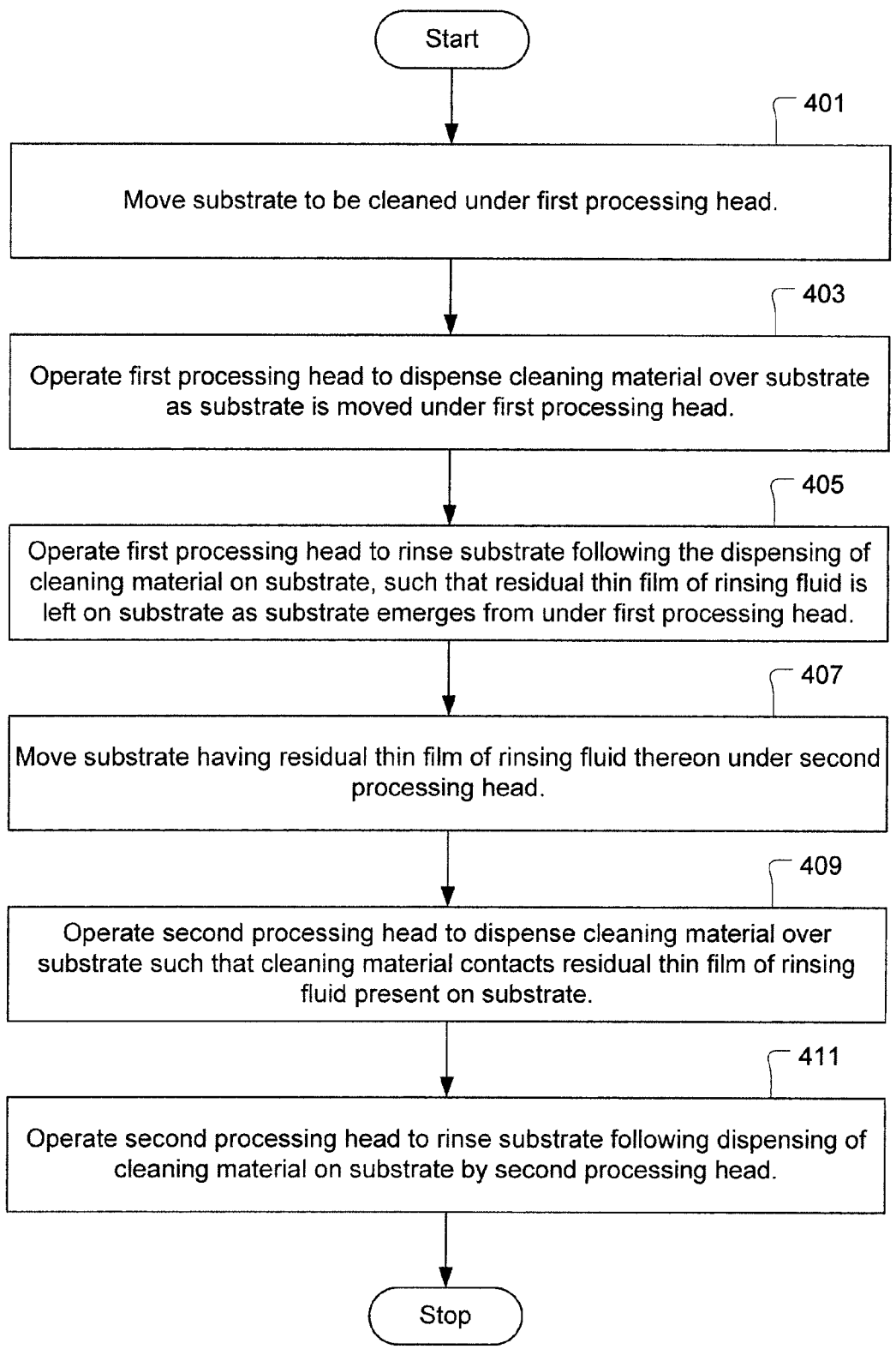
FIG. 4 shows a flowchart of a method for cleaning a substrate, in accordance with another embodiment of the present invention.

FIG. 4 shows a flowchart of a method for cleaning a substrate, in accordance with another embodiment of the present invention. The method includes an operation 401 for moving a substrate to be cleaned under a first processing head. In an operation 403, the first processing head is operated to dispense a cleaning material over the substrate as the substrate is moved under the first processing head. The cleaning material includes one or more viscoelastic materials for entrapping contaminants present on the substrate. The cleaning material of the present method corresponds to the cleaning material 100 described above. Therefore, the cleaning material of the present method includes one or more viscoelastic materials for entrapping contaminants present on the surface of the substrate. In one embodiment, the cleaning material used in the present method is defined as a polar solvent having polyacrylamide dissolved therein.

The method continues with an operation 405 in which the first processing head is operated to rinse the substrate following the dispensing of the cleaning material on the substrate. The operation 405 is performed such that a residual thin film of the rinsing fluid is left on the substrate as the substrate emerges from under the first processing head. In one embodiment, a vacuum of the first processing head is controlled to leave a controlled thickness of the residual thin film of the rinsing fluid on the substrate. In various embodiments of the present method, the rinsing fluid is defined as one or more of deionized water, dimethyl sulfoxide, dimethyl formamide, dimethyl acetate, a polar solvent, and an atomized polar solvent.

In an operation 407, the substrate having the residual thin film of the rinsing fluid thereon is moved under a second processing head. According to an operation 409, the second processing head is operated to dispense the cleaning material over the substrate such that the cleaning material contacts the residual thin film of rinsing fluid present on the substrate. Then, in an operation 411, the second processing head is operated to rinse the substrate following the dispensing of the cleaning material on the substrate by the second processing head.

In one embodiment, each of the first and second processing heads is operated to dispense the cleaning material across the substrate along a dispense line extending perpendicular to a diametrical chord of the substrate, while the substrate is moved in a direction of the diametrical chord. Additionally, a top surface of the substrate is maintained in a substantially horizontal orientation as the substrate is moved under the first and second processing heads. The first and second processing heads are maintained in sufficiently close proximity to the top surface of the substrate no as to respectively establish controlled meniscuses of the rinsing fluid between the first and second processing heads and the top surface of the substrate. Moreover, in one embodiment, the method can also include operations for moving the substrate under a third processing head, and operating the third processing head to d the substrate.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention.

What is claimed is:

1. An apparatus for cleaning a substrate, comprising:
   a substrate carrier defined to move a substrate in a substantially linear path while maintaining the substrate in a substantially horizontal orientation;
   a drive rail and a guide rail defined to provide for controlled linear movement of the substrate carrier, such that the substrate carrier is maintained in the substantially horizontal orientation along the substantially linear path, the substantially linear path defined by the drive rail and the guide rail;
   a first processing head mounted in physical contact with a top surface of the drive rail, the first processing head mounted in physical contact with a top surface of the guide rail, a vertical position of the first processing head indexed to both a vertical position of the drive rail and a vertical position of the guide rail such that the vertical position of the first processing head is indexed to a vertical position of the substrate carrier, the first processing head positioned over the substantially linear path of the substrate such that the first processing head is defined to dispense a cleaning material on the substrate through an underside of the first processing head and dispense a rinsing fluid on the substrate through the underside of the first processing head, the first processing head defined to apply a controlled vacuum suction through the underside of the first processing head to remove cleaning material and a portion of the rinsing fluid from the substrate so as to leave a residual thin film of the rinsing fluid on the substrate, the first processing head defined to extend below the top surface of the drive rail and below the top surface of the guide rail such that the underside of the first processing head is positioned between the top surface of the drive rail and a bottom surface of the drive rail and between the top surface of the guide rail and a bottom surface of the guide rail; and a second processing head mounted in physical contact with the top surface of the drive rail, the second processing head mounted in physical contact with the top surface of the guide rail, a vertical position of the second processing head indexed to both the vertical position of the drive rail and the vertical position of the guide rail such that the vertical position of the second processing head is indexed to the vertical position of the substrate carrier, the second processing head positioned over the path of the substrate behind the first processing head relative to a direction of travel of the substrate carrier, the second processing head defined to dispense the cleaning material through an underside of the second processing head to impact the residual thin film of the rinsing fluid present on the substrate, the second processing head defined to dispense the rinsing fluid through the underside of the second processing head onto the substrate so as to rinse the cleaning material from the substrate, the second processing head defined to extend below the top surface of the drive rail and below the top surface of the guide rail such that the underside of the second processing head is positioned between the top surface of the drive rail and the bottom surface of the drive rail and between the top surface of the guide rail and the bottom surface of the guide rail.

2. An apparatus for cleaning a substrate as recited in claim 1, wherein each of the first and second processing heads is positioned to dispense the cleaning material across the substrate along a dispense line extending perpendicular to linear path along which the substrate carrier is defined to move the substrate.

3. An apparatus for cleaning a substrate as recited in claim 1, wherein the linear path of the substrate carrier is defined such that a top surface of the substrate is substantially horizontal and parallel to the underside of each of the first and second processing heads.

4. An apparatus for cleaning a substrate as recited in claim 3, wherein the first and second processing heads are positioned in sufficiently close proximity to the linear path of the substrate carrier such that controlled meniscuses of the rinsing fluid are respectively established between the undersides of each of the first and second processing heads and the top surface of the substrate.

5. An apparatus for cleaning a substrate as recited in claim 1, wherein the first processing head includes a vacuum channel through which the controlled vacuum suction is applied, the vacuum channel defined to enable control of a thickness of the residual thin film of the rinsing fluid to be left on the substrate by the first processing head.

6. An apparatus for cleaning a substrate as recited in claim 5, wherein the first processing head includes a rinsing fluid supply channel through which the rinsing fluid is dispensed on the substrate.

7. An apparatus for cleaning a substrate as recited in claim 6, wherein the vacuum channel is defined to have a continuous opening that surrounds the rinsing fluid supply channel at the underside of the first processing head.

8. An apparatus for cleaning a substrate as recited in claim 7, wherein the vacuum channel is defined to apply the controlled vacuum suction in a substantially uniform manner around the rinsing fluid supply channel.

9. An apparatus for cleaning a substrate as recited in claim 6, wherein the second processing head includes a second vacuum channel through which a second controlled vacuum suction is applied.

10. An apparatus for cleaning a substrate as recited in claim 9, wherein the second processing head includes a second rinsing fluid supply channel through which the rinsing fluid is dispensed on the substrate.

11. An apparatus for cleaning a substrate as recited in claim 10, wherein the second vacuum channel is defined to have a continuous opening that surrounds the second rinsing fluid supply channel at the underside of the second processing head.

12. An apparatus for cleaning a substrate as recited in claim 11, wherein the second vacuum channel is defined to apply the second controlled vacuum suction in a substantially uniform manner around the second rinsing fluid supply channel.

13. An apparatus for cleaning a substrate as recited in claim 1, wherein the cleaning material is defined as a polar solvent having polyacrylamide dissolved therein, and wherein the rinsing fluid is deionized water.

14. An apparatus for cleaning a substrate as recited in claim 1, further comprising:
a third processing head positioned over the path of the substrate behind the second processing head relative to a direction of travel of the substrate carrier, the third processing head defined to dry the substrate.

15. An apparatus for cleaning a substrate as recited in claim 1, further comprising:
a first lower processing head positioned beneath the path of the substrate and beneath the first processing head, the first lower processing head including a rinsing fluid supply channel defined to apply a second rinsing fluid to a bottom surface of the substrate; and
a second lower processing head positioned beneath the path of the substrate and beneath the second processing head, the second lower processing head including a rinsing fluid supply channel defined to apply the second rinsing fluid to the bottom surface of the substrate.

16. An apparatus for cleaning a substrate as recited in claim 15, wherein each of the first and second lower processing heads includes a respective vacuum channel defined to apply a suction to remove the second rinsing fluid from the bottom surface of the substrate.

17. An apparatus for cleaning a substrate as recited in claim 16, wherein the rinsing fluid supply channels and vacuum channel of the first and second lower processing heads are defined such that a respective meniscus of the second rinsing fluid is established between each of the first and second lower processing heads and the bottom surface of the substrate.

* * * * *